United States Patent
Hausrath et al.

(10) Patent No.: US 10,562,810 B2
(45) Date of Patent: Feb. 18, 2020

(54) LOW DIELECTRIC GLASS COMPOSITION, FIBERS, AND ARTICLE

(71) Applicant: AGY Holding Corporation, Aiken, SC (US)

(72) Inventors: Robert Lurie Hausrath, Aiken, SC (US); Anthony Vincent Longobardo, Johnston, SC (US); Brian Gene Ruppel, Arden, NC (US)

(73) Assignee: AGY Holding Corporation, Aikien, SC (US)

( * ) Notice: Subject to any disclaimer, the term of this patent is extended or adjusted under 35 U.S.C. 154(b) by 0 days.

(21) Appl. No.: 16/474,287

(22) PCT Filed: Dec. 21, 2017

(86) PCT No.: PCT/US2017/067785
§ 371 (c)(1),
(2) Date: Jun. 27, 2019

(87) PCT Pub. No.: WO2018/125736
PCT Pub. Date: Jul. 5, 2018

(65) Prior Publication Data
US 2019/0337839 A1 Nov. 7, 2019

Related U.S. Application Data

(60) Provisional application No. 62/439,755, filed on Dec. 28, 2016.

(51) Int. Cl.
| | |
|---|---|
| *C03C 13/00* | (2006.01) |
| *H05K 1/03* | (2006.01) |
| *C03C 3/097* | (2006.01) |
| *C03C 3/087* | (2006.01) |
| *C03C 4/16* | (2006.01) |

(52) U.S. Cl.
CPC ............. *C03C 13/00* (2013.01); *C03C 3/087* (2013.01); *C03C 3/097* (2013.01); *C03C 4/16* (2013.01); *H05K 1/0306* (2013.01); *C03C 2203/10* (2013.01); *H05K 2201/01* (2013.01)

(58) Field of Classification Search
CPC ......... C03C 13/00; C03C 3/097; C03C 3/091; C03C 3/118; C03C 4/16; H05K 1/0306; H05K 2201/01
See application file for complete search history.

(56) References Cited

U.S. PATENT DOCUMENTS

| | | |
|---|---|---|
| 2003/0054936 A1 | 3/2003 | Tamura |
| 2004/0175557 A1* | 9/2004 | Creux ..................... C03C 3/118 428/299.7 |
| 2006/0287185 A1 | 12/2006 | Creux et al. |

FOREIGN PATENT DOCUMENTS

| | | | |
|---|---|---|---|
| CN | 102503153 B | | 10/2013 |
| JP | 2010260781 A | * | 11/2010 |
| JP | 2016098118 A | * | 5/2016 |
| WO | 2010011701 A2 | | 1/2010 |

OTHER PUBLICATIONS

Young, Lee W.; The International Search Report and Written Opinion; PCT/US17/67785; The International Searching Authority; 9 pages; dated Feb. 14, 2018 (completion date).

Olsen, Kaj K.; The International Preliminary Report on Patentability (Chapter II of Patent Cooperation Treaty); PCT/US17/67785; The Preliminary Examining Authority; 6 pages; dated Feb. 11, 2019 (completion date).

\* cited by examiner

*Primary Examiner* — Elizabeth A. Bolden
(74) *Attorney, Agent, or Firm* — Nexsen Pruet, LLC; Todd A. Serbin

(57) ABSTRACT

Glass compositions and glass fibers having low dielectric constants and low dissipation factors that may be suitable for use in electronic applications and articles are disclosed. The glass fibers and compositions of the present invention may include between 45.0 to 58.0 weight percent $SiO_2$; greater than 18.0 weight percent $B_2O_3$ and no more than 26.0 weight percent $B_2O_3$; greater than 16.0 weight percent $Al_2O_3$ and no more than 23.0 weight percent $Al_2O_3$; between 0.25 to 12.0 weight percent $P_2O_5$; greater than 0.25 weight percent CaO and less than 5.00 weight percent CaO; less than 4.50 weight percent MgO; greater than 0.25 weight percent CaO+MgO and less than 5.00 weight percent CaO+MgO; less than 0.80 weight percent $Fe_2O_3$; and less than 0.50 weight percent $TiO_2$. Further, the glass composition has a glass viscosity of 1000 poise at a temperature greater than 1350 degrees Celsius.

23 Claims, No Drawings

LOW DIELECTRIC GLASS COMPOSITION, FIBERS, AND ARTICLE

RELATED APPLICATIONS

This application is a U.S. National Phase application of PCT Patent Application No. PCT/US2017/067785, having International filing date of Dec. 21, 2017, and which claims the benefit of priority under 35 U.S.C. § 119(e) of U.S. Provisional Patent Application No. 62/439,755 filed Dec. 28, 2016. The contents of the above applications are all incorporated by reference as if fully set forth herein in their entirety.

BACKGROUND

The present invention relates to glass compositions and fibers. More particularly, the present invention relates to glass compositions and fibers having a low dielectric constant and a low dissipation factor. Further, the glass fibers of the present invention are preferably suitable for use in connection with electronic related devices such as reinforcement for printed circuit board laminates and the like.

Modern electronic devices commonly include printed circuit boards reinforced with glass fibers. Many modern electronic devices, such as mobile or stationary wireless telephones, computers, smartphones, tablets, and the like, have electronic systems that operate at high processing speeds and high or ultra-high frequencies. When glass is exposed to such a high or ultra-high frequency electromagnetic field, the glass absorbs at least some energy and converts the absorbed energy to heat. The energy that is converted by the glass into heat is called dielectric loss energy. This dielectric loss energy is proportional to the "dielectric constant" and the "dielectric loss tangent" of the glass composition, as indicated by the following expression:

$$W = k \cdot f \cdot v^2 \cdot \varepsilon \cdot (\tan \delta)$$

In the above expression, "W" is the dielectric loss energy in the glass, "k" is a constant, "f" is the frequency, "$v^2$" is the potential gradient, "$\varepsilon$" is the dielectric constant, and "tan $\delta$" is the dielectric loss tangent. The dielectric loss tangent (tan $\delta$) is dimensionless and is often referred to in the art by the following synonyms: "loss factor," or more commonly, "dissipation factor" (Df). As the above expression indicates, the dielectric loss energy "W" increases with an increase in the dielectric constant and the dielectric loss tangent (dissipation factor, Df) of the glass, and/or with an increase in frequency.

Two types of glass fibers commonly used to reinforce printed circuit boards are E-glass and D-glass. E-glass, however, has a relatively high dielectric constant ranging from about 6.1 and a relatively high dissipation factor ranging from about 38×10$^{-4}$ at a frequency of about 10 GHz at room temperature. Accordingly, because E-glass can yield relatively high dielectric losses, E-glass is a poor reinforcement material for printed circuit boards having higher densities of electronic components and higher processing speeds. D-glass, on the other hand, has a relatively low dielectric constant and dissipation factor. D-glass, however, has relatively high melting temperatures, relatively poor workability, relatively poor mechanical performance, and relatively poor water resistance. In addition, D-glass may inadequately adhere to epoxy resins, and commonly includes imperfections in the form of striae and bubbles. Accordingly, neither E-glass nor D-glass are ideally suited for use as reinforcement fibers in high speed printed circuit boards, and neither is well-suited for circuit boards that operate at high or ultra-high frequencies from about 100 MHz to about 18 GHz.

The present invention discloses glass compositions and fibers having low dielectric properties that are preferably suitable for use in printed circuit boards of high speed and ultra-high speed electronic devices. Additionally, the glass compositions and fibers of the present invention preferably have increased workability properties and performance characteristics when compared to known glasses, such as E-glass or D-glass.

SUMMARY

Glass compositions for the formation of glass fibers that are preferably suitable for use in electronic applications and articles and that are preferably capable of being economically formed through continuous fiberization into glass fibers are provided.

In one embodiment of the present invention, a glass composition is disclosed and includes between 45.0 to 58.0 weight percent $SiO_2$; greater than 18.0 weight percent $B_2O_3$ and no more than 26.0 weight percent $B_2O_3$; greater than 16.0 weight percent $Al_2O_3$ and no more than 23.0 weight percent $Al_2O_3$; between 0.25 to 12.0 weight percent $P_2O_5$; greater than 0.25 weight percent CaO and less than 5.00 weight percent CaO; less than 4.50 weight percent MgO; greater than 0.25 weight percent CaO+MgO and less than 5.00 weight percent CaO+MgO; less than 0.80 weight percent $Fe_2O_3$; and less than 0.50 weight percent $TiO_2$.

Alternatively, the glass composition disclosed above may include one or more of the following: no less than 45.5 weight percent $SiO_2$; no more than 57.5 weight percent $SiO_2$; no less than 18.5 weight percent $B_2O_3$; no more than 25.0 weight percent $B_2O_3$; no more than 22.50 weight percent $Al_2O_3$; no more than 11.0 weight percent $P_2O_5$; less than 4.5 weight percent CaO; less than 4.25 weight percent MgO; less than 4.5 weight percent CaO+MgO; no more than 0.70 weight percent $Fe_2O_3$; and/or no more than 0.45 weight percent $TiO_2$.

In yet a further alternative embodiment, the glass compositions disclosed above may include one or more of the following: no less than 46.0 weight percent $SiO_2$; no more than 57.0 weight percent $SiO_2$; no less than 19.0 weight percent $B_2O_3$; no more than 24.0 weight percent $B_2O_3$; no more than 22.0 weight percent $Al_2O_3$; no more than 10.0 weight percent $P_2O_5$; less than 4.0 weight percent CaO; less than 3.75 weight percent MgO; less than 4.0 weight percent CaO+MgO; no more than 0.60 weight percent $Fe_2O_3$; and/or no more than 0.4 weight percent $TiO_2$.

In another embodiment of the present invention, a glass composition is disclosed and includes between 45.5 to 57.5 weight percent $SiO_2$; between 18.5 to 25.0 weight percent $B_2O_3$; greater than 16.0 weight percent $Al_2O_3$ and no more than 22.50 weight percent $Al_2O_3$; between 0.25 to 11.0 weight percent $P_2O_5$; greater than 0.25 weight percent CaO and less than 4.5 weight percent CaO; less than 4.25 weight percent MgO; greater than 0.25 weight percent CaO+MgO and less than 4.5 weight percent CaO+MgO; less than 0.70 weight percent $Fe_2O_3$; and less than 0.45 weight percent $TiO_2$.

In yet a further alternative embodiment of the present invention, a glass composition is disclosed and includes between 46.0 to 57.0 weight percent $SiO_2$; between 19.0 to 24.0 weight percent $B_2O_3$; greater than 16.0 weight percent $Al_2O_3$ and no more than 22.0 weight percent $Al_2O_3$; between 0.25 to 10.0 weight percent $P_2O_5$; greater than 0.25 weight percent CaO and less than 4.0 weight percent CaO; less than 3.75 weight percent MgO; greater than 0.25 weight percent CaO+MgO and less than 4.0 weight percent CaO+MgO; less than 0.60 weight percent $Fe_2O_3$; and less than 0.40 weight percent $TiO_2$.

The glass composition of the present invention may have a liquidus temperature greater than 1100° C. In an alternative embodiment, the glass composition may have a liquidus temperature greater than 1150° C. In yet a further alternative embodiment, the glass composition may have a liquidus temperature greater than 1200° C. The glass composition of the present invention may have a glass viscosity of 1000 poise at a temperature greater than 1350° C. Alternatively, the glass composition may have a glass viscosity of 1000 poise at a temperature greater than 1355° C. In yet a further alternative embodiment, the glass composition may have a glass viscosity of 1000 poise at a temperature greater than 1360° C.

The present invention includes glass fibers formed from the above disclosed glass compositions. For example, the present invention includes a low dielectric constant glass fiber formed from a glass composition having between 45.0 to 58.0 weight percent $SiO_2$; greater than 18.0 weight percent $B_2O_3$ and no more than 26.0 weight percent $B_2O_3$; greater than 16.0 weight percent $Al_2O_3$ and no more than 23.0 weight percent $Al_2O_3$; between 0.25 to 12.0 weight percent $P_2O_5$; greater than 0.25 weight percent CaO and less than 5.00 weight percent CaO; less than 4.50 weight percent MgO; greater than 0.25 weight percent CaO+MgO and less than 5.00 weight percent CaO+MgO; less than 0.80 weight percent $Fe_2O_3$; and less than 0.50 weight percent $TiO_2$.

Alternatively, the glass fiber composition disclosed above may include one or more of the following: no less than 45.5 weight percent $SiO_2$; no more than 57.5 weight percent $SiO_2$; no less than 18.5 weight percent $B_2O_3$; no more than 25.0 weight percent $B_2O_3$; no more than 22.50 weight percent $Al_2O_3$; no more than 11.0 weight percent $P_2O_5$; less than 4.5 weight percent CaO; no more than 4.25 weight percent MgO; less than 4.5 weight percent CaO+MgO; no more than 0.70 weight percent $Fe_2O_3$; and/or no more than 0.45 weight percent $TiO_2$.

In yet a further alternative embodiment, the glass fiber compositions disclosed above may include one or more of the following: no less than 46.0 weight percent $SiO_2$; no more than 57.0 weight percent $SiO_2$; no less than 19.0 weight percent $B_2O_3$; no more than 24.0 weight percent $B_2O_3$; no more than 22.0 weight percent $Al_2O_3$; no more than 10.0 weight percent $P_2O_5$; less than 4.0 weight percent CaO; less than 3.75 weight percent MgO; less than 4.0 weight percent CaO+MgO; no more than 0.60 weight percent $Fe_2O_3$; and/or no more than 0.4 weight percent $TiO_2$.

In an alternative embodiment of the present invention, the low dielectric constant glass fiber includes a glass composition having between 45.5 to 57.5 weight percent $SiO_2$; between 18.5 to 25.0 weight percent $B_2O_3$; greater than 16.0 weight percent $Al_2O_3$ and no more than 22.50 weight percent $Al_2O_3$; between 0.25 to 11.0 weight percent $P_2O_5$; greater than 0.25 weight percent CaO and less than 4.5 weight percent CaO; less than 4.25 weight percent MgO; greater than 0.25 weight percent CaO+MgO and less than 4.5 weight percent CaO+MgO; less than 0.70 weight percent $Fe_2O_3$; and less than 0.45 weight percent $TiO_2$.

In yet a further alternative embodiment, the present invention includes a low dielectric constant glass fiber formed from a glass composition having between 46.0 to 57.0 weight percent $SiO_2$; between 19.0 to 24.0 weight percent $B_2O_3$; greater than 16.0 weight percent $Al_2O_3$ and no more than 22.0 weight percent $Al_2O_3$; between 0.25 to 10.0 weight percent $P_2O_5$; greater than 0.25 weight percent CaO and less than 4.0 weight percent CaO; less than 3.75 weight percent MgO; greater than 0.25 weight percent CaO+MgO and less than 4.0 weight percent CaO+MgO; less than 0.60 weight percent $Fe_2O_3$; and less than 0.40 weight percent $TiO_2$.

The low dielectric-constant glass fibers of the present invention may have a dielectric constant less than or equal to 6 at a frequency of 10 GHz. Alternatively, the glass fibers may have a dielectric constant less than or equal to 4.60 at a frequency of 10 GHz. In a further alternative embodiment, the glass fibers may have a dielectric constant less than or equal to 4.55 at a frequency of 10 GHz. Further, the glass fibers of the present invention may have a dissipation factor less than or equal to $38 \times 10^{-4}$ at a frequency of 10 GHz at room temperature. Alternatively, the glass fibers may have a dissipation factor less than or equal to $30 \times 10^{-4}$ at a frequency of 10 GHz at room temperature. In a further alternative embodiment, the glass fibers of the present invention may have a dissipation factor less than or equal to $25 \times 10^{-4}$ at a frequency of 10 GHz at room temperature.

The present invention also includes a fiberglass reinforced article, such as a printed circuit board, incorporating glass fibers of the present invention. Further, the present invention includes a product incorporating a glass fiber, such as disclosed above, and wherein the product may be a printed circuit board, a woven fabric, a non-woven fabric, a unidirectional fabric, a chopped strand, a chopped strand mat, a composite material, and a communication signal transport medium.

The present invention includes a process for providing continuous, manufacturable low dielectric glass fibers. The process may include the steps of providing a glass composition, such as disclosed herein, to a melting zone of a glass melter; heating the composition to a forming temperature in excess of the liquidus temperature; and continuously fiberizing the molten glass whereby a low dielectric constant and low dissipation factor glass fiber is produced.

DETAILED DESCRIPTION OF EMBODIMENTS OF THE INVENTION

The present invention is directed to glass compositions and fibers preferably having low dielectric constant values and low dissipation factors, also referred to herein as tan δ. The glass fibers of the present invention are preferably suitable for use in connection electronic devices and systems that operate at high processing speeds and/or high frequencies, such as mobile or stationary wireless telephones, computers, smartphones, tablets, and the like. The glass fibers of the present invention preferably yield a lower dielectric constant and dissipation factor than that of E-glass but with better workability properties than D-glass. While mainly described in terms of its use in connection with electronic devices and reinforcement of printed circuit boards, other uses and benefits of the glass compositions and glass fibers of the present invention may be contemplated without departing from the spirit and scope of the present invention. The present invention also discloses fiberglass reinforced articles, products incorporating glass fibers, such as printed circuit boards, woven fabrics, non-woven fabrics, unidirectional fabrics, chopped strands, chopped strand mats, composite material, and communication signal transport mediums, and a process for providing continuous and manufacturable low dielectric glass fibers.

The composition of the present invention is generally composed of one or more of the following oxides including silicon oxide (SiO$_2$), boron oxide (B$_2$O$_3$), aluminum oxide (Al$_2$O$_3$), calcium oxide (CaO), phosphorous oxide (P$_2$O$_5$), magnesium oxide (MgO), iron oxide (Fe$_2$O$_3$), and titanium oxide (TiO$_2$). Additional oxides may be present as discussed below without departing from the spirit and scope of the present invention. The composition of the present invention may have a liquidus temperature greater than 1100° C. and a glass viscosity of 1000 poise at a temperature greater than 1350° C. Further, the glass fibers of the present invention preferably have a dielectric constant less than or equal to 6, and/or a dissipation factor less than or equal to 38×10$^{-4}$ at a frequency of 10 GHz at room temperature. Beneficially, the composition of the present glass preferably has the ability to fiberize continuously because of its positive difference between the T log 3 viscosity temperature and liquidus temperature ($\Delta T_3$).

Unless otherwise stated, the following terms used in the specification and claims have the meanings given below.

As used herein, the term "liquidus" is given its ordinary and customary meaning, generally inclusive of the temperature at which equilibrium exists between liquid glass and its primary crystalline phase, whereas at all temperatures above the liquidus, the glass melt is free from crystals in its primary phase and at temperatures below the liquidus, crystals may form in the melt. The liquidus temperature therefore provides the lower temperature limit below which it is possible to continuously fiberize the glass.

The term "fiberizing temperature" or "T log 3 viscosity temperature" is understood to mean the temperature at which the glass has a viscosity equal to 1000 poise (denoted by T log 3).

As used herein, the term "delta-T," also referred to as "($\Delta T$)," is given its ordinary and customary meaning in the art, generally inclusive of the difference between the fiberizing temperature and the liquidus, and thus, a fiberizing property of the glass composition. The larger the delta-T, the more process flexibility exists during the formation of glass fibers and the less likely devitrification (crystallization) of the glass melt will occur during melting and fiberizing. Typically, the greater the delta-T, the lower the production cost of the glass fibers, in part by extending bushing life and by providing a wider fiber-forming process window.

The term "fiber" refers to an elongate body, the length dimension of which is greater than the transverse dimensions of width and thickness. Accordingly, the term fiber includes monofilament, multifilament, ribbon, strip, staple and other forms of chopped, cut or discontinuous fiber and the like having regular or irregular cross-sections. Fiber and filament are used interchangeably herein.

The term "E-glass" is used according to its meaning as described in ASTM D-578.

The term "D-glass" refers to a glass composition having the properties as set forth herein.

By "low dielectric constant" is meant a glass fiber having a dielectric constant lower than E-Glass. By way of example, E-glass, has a dielectric constant of about 6.1 at a frequency of 10 GHz at room temperature.

By "low dissipation factor" is meant a glass fiber having a dissipation factor lower than E-Glass. By way of example, E-glass has a dissipation factor of about 38×10$^{-4}$ at a frequency of about 10 GHz at room temperature.

By "low dielectric glass fiber" is meant a glass fiber with a low dielectric constant and low dissipation factor as defined herein.

Glass compositions for the formation of glass fibers that are preferably suitable for use in electronic applications and articles and that are preferably capable of being economically formed through continuous fiberization into glass fibers are provided.

The glass fiber of the present invention typically includes a composition having between 45 and 58 weight percent silicon dioxide (SiO$_2$) (also referred to herein as silica). Alternatively, the silicon dioxide content may be between 45.5 and 57.5 weight percent. Further alternatively, the silicon dioxide content may be between 46 and 57 weight percent. In yet a further embodiment, the silicon dioxide content may be less than 56.75 weight percent. In yet an even further embodiment, the silicon dioxide content may be less than 56.50 weight percent. When the silicon dioxide percentage is outside of this range, the viscosity and fiberization of the glass is typically affected. For example, the viscosity of the glass may decrease to the extent that devitrification (crystallization) during fiberization results when silicon dioxide is less than 45 weight percent of the total composition of the glass fiber. In contrast, when silicon dioxide is greater than 58 weight percent of the total composition of the glass fiber, the glass may become too viscous thereby making it more difficult to melt, homogenize, and refine. Thus, the silica content is preferably between 45 and 58 weight percent of the total composition of the glass. Further, when combined with the other constituents as set forth herein, a silica content between 45.00 and 58.00 weight percent typically yields a glass fiber having a desirable low dielectric constant as well as a low dissipation factor. In one embodiment of the glass fiber and/or glass composition of the present invention, the silica content is at least 45.50 weight percent. Alternatively, the silica content is at least 46.00 weight percent. In another embodiment of the glass fiber and/or glass composition of the present invention, the silica content is no more than 57.50 weight percent. Alternatively, the silica content is no more than 57.00 weight percent. Yet further alternatively, the silica content is no more than 56.75 weight percent. In another embodiment, the silica content is no more than 56.50 weight percent.

The glass fiber of the present invention typically also includes a composition having greater than 18 weight percent boron oxide (B$_2$O$_3$) and no more than 26 weight percent boron oxide. Alternatively, the boron oxide content may be between 18.5 and 25 weight percent. Further alternatively, the boron oxide content may be between 19 and 22 weight percent. A high percentage of boron oxide, such as above 26 weight percent, may cause an excessive loss of B$_2$O$_3$ during melting, poor homogeneity, low strength, and poor mechanical properties. Further, a low percentage of boron oxide, such as at or below 18 weight percent, may cause insufficient dielectric properties. Thus, the boron oxide content is preferably greater than 18 weight percent and no more than 26 weight percent of the total composition of the glass. Further, when combined with the other constituents as set forth herein, a boron oxide content greater than 18.00 weight percent and no more than 26.00 weight percent typically yields a glass fiber having a desirable low dielectric constant as well as a low dissipation factor. In one embodiment of the glass fiber and/or glass composition of the present invention, the boron oxide content is at least 18.50 weight percent. Alternatively, the boron oxide content is at least 19.00 weight percent. In another embodiment of the glass fiber and/or glass composition of the present invention, the boron oxide content is no more than 25.00 weight percent. Alternatively, the boron oxide content is no more than 24.00 weight percent.

The glass fiber of the present invention typically also includes a composition having greater than 16 weight percent aluminum oxide ($Al_2O_3$) (also referred to herein as alumina) and no more than 23 weight percent aluminum oxide. Alternatively, the aluminum oxide content may be greater than 16 weight percent and no more than 22.5 weight percent. Further alternatively, the aluminum oxide content may be greater than 16 weight percent and no more than 22 weight percent. The percentage of aluminum oxide with respect to the total composition of the glass fiber may also affect the viscosity and fiberization process. For example, a high percentage of aluminum oxide, such as above 23 weight percent, may cause the melt viscosity to decrease so that devitrification during fiberization results. A low percentage of aluminum oxide, such as at or below 18 weight percent, may cause phase separation and poor fiber formation. Thus, the alumina content is preferably greater than 16 weight percent and no more than 23 weight percent of the total composition of the glass. Further, when combined with the other constituents as set forth herein, an alumina content between 16.00 and 23.00 weight percent typically yields a glass fiber having a desirable low dielectric constant as well as a low dissipation factor. In one embodiment of the glass fiber and/or glass composition of the present invention, the alumina content is no more than 22.50 weight percent. Alternatively, the alumina content is no more than 22.00 weight percent.

The weight ratios between silicon dioxide, aluminum oxide, and boron oxide may impact the dielectric constant and/or dissipation factor of the glass fiber of the present invention. Advantageously, the weight ratio of silicon dioxide to aluminum oxide may be between about 1.9 to about 3.7. Alternatively, the weight ratio of silicon dioxide to boron oxide may be between about 1.7 to about 3.3. Further alternatively, the weight ratio of boron oxide to aluminum oxide may be about 0.7 to about 1.7.

The glass fiber of the present invention typically also includes a composition having between 0.25 and 12 weight percent phosphorus oxide ($P_2O_5$) (also referred to as phosphorous pentoxide). Alternatively, the phosphorous oxide content may be between 0.25 and 11 weight percent. Further alternatively, the phosphorous oxide content may be between 0.25 and 10 weight percent. A high percentage of phosphorous oxide, such as above 12 percent, may cause phase separation and poor fiber formation as well as may cause refractory and precious metal alloy attack. Further, a low percentage of phosphorous oxide, such as below 0.25 weight percent, may cause poor dielectric properties. Thus, the phosphorous oxide content is preferably between 0.25 and 12 weight percent of the total composition of the glass. Further, when combined with the other constituents as set forth herein, a phosphorous oxide content greater than 0.25 weight percent and no more than 12.00 weight percent typically yields a glass fiber having a desirable low dielectric constant as well as a low dissipation factor. In one embodiment of the glass fiber and/or glass composition of the present invention, the phosphorous oxide content is no more than 11.00 weight percent. Alternatively, the phosphorous oxide content is no more than 10.00 weight percent.

The glass fiber composition of the present invention may also include calcium oxide (CaO) (also referred to herein as calcia). The glass fiber of the present invention typically includes a composition having greater than 0.25 weight percent calcium oxide and less than 5.0 weight percent calcium oxide. Alternatively, the calcium oxide content may be greater than 0.25 weight percent and less than 4.5 weight percent. Further alternatively, the calcium oxide content may be greater than 0.25 weight percent and less than 4.25 weight percent. Yet further alternatively, the calcium oxide content may be greater than 0.25 weight percent and less than 4.0 weight percent. The weight percent of calcium oxide may impact the viscosity and devitrification process of the glass fiber. A high percentage of calcium oxide, such as above 5.0 weight percent, or even as high as 4 weight percent, may cause insufficient dielectric properties. Further, a low percentage of calcium oxide, such as at or below 0.25 weight percent, may cause poor fiber formation. For example, below 0.25 weight percent calcia, the viscosity is too high and the resulting glass homogeneity is insufficient for acceptable continuous fiber formation. Thus, the calcium oxide content is preferably greater than 0.25 weight percent and less than 5.0 weight percent of the total composition of the glass. Further preferably, the calcium oxide content is greater than 0.25 weight percent and less than 4.0 weight percent of the total composition of the glass. Further, when combined with the other constituents as set forth herein, a calcium oxide content greater than 0.25 weight percent and less than 5.0 weight percent typically yields a glass fiber having a desirable low dielectric constant as well as a low dissipation factor. In one embodiment of the glass fiber and/or glass composition of the present invention, the calcia content is less than 4.5 weight percent. Alternatively, the calcia content is less than 4.25 weight percent. Further alternatively, the calcia content is less than 4.00 weight percent.

The glass fiber composition of the present invention may also include magnesium oxide (MgO) (also referred to herein as magnesia). The glass fiber of the present invention may include a composition having less than 4.5 weight percent magnesium oxide. Alternatively, the magnesium oxide content may be less than 4.25 weight percent. Further alternatively, the magnesium oxide content may be less than 4.0 weight percent. In yet a further alternative embodiment, the magnesium oxide content may be less than 3.75 weight percent. Like calcium oxide, the weight percent of magnesium oxide also may impact the viscosity and devitrification process of the glass fiber. Further, a high percentage of magnesium oxide, such as at or above 4.5 weight percent, or even as high as 4 weight percent, may cause insufficient dielectric properties. Thus, when combined with the other constituents as set forth herein, a magnesium oxide content less than 4.50 weight percent typically yields a glass fiber having a desirable low dielectric constant as well as a low dissipation factor. Further, at least some magnesium oxide, such as at least 0.01 weight percent, at least 0.05 weight percent, or 0.1 weight percent, is often present in the composition of the present invention via impurities from other components. Thus, the magnesium oxide content is preferably less than 4.50 weight percent of the total composition of the glass.

The total weight percent of calcium oxide and magnesium oxide often influences the liquidus temperature and viscosity of the glass as well as influences the dielectric properties of the glass. Advantageously, the combined weight percent of CaO+MgO may be at least 0.25 and less than 5.00. Alternatively, the combined weight percent of CaO+MgO may be at least 0.25 and less than 4.50. Further alternatively, the combined weight percent of CaO+MgO may be at least 0.25 and less than 4.25. And further alternatively, the combined weight percent of CaO+MgO may be at least 0.25 and less than 4.00. A combined weight percent of magnesium oxide and calcium oxide above 5.0 percent, or even as high as 4 percent, may cause insufficient dielectric properties. Further, a low percentage of combined calcium oxide and magnesium oxide, such as at or below 0.25 weight percent, may cause poor fiber formation. For example, below 0.25 weight percent CaO+MgO, the viscosity is too high and the resulting glass homogeneity is insufficient for acceptable continuous fiber formation. Thus, the CaO+MgO content is preferably greater than 0.25 weight percent and less than 5 weight percent of the total composition of the glass. Alternatively, the CaO+MgO content is less than 4.5 weight percent of the total composition of the glass. Yet further alternatively, the CaO+MgO content is less than 4.25 weight percent of the total composition of the glass. Even further alternatively, the CaO+MgO content is less than 4.00 weight percent of the total composition of the glass.

Iron oxide ($Fe_2O_3$) may be present in the instant glass composition. In one embodiment, the weight percent of iron oxide is less than 0.80. Alternatively, the weight percent of iron oxide is no more than 0.70. Further alternatively, the weight percent of iron oxide is no more than 0.60. Iron oxide is commonly introduced as an impurity with other raw materials. Thus, iron oxide may be present in the glass composition at a weight percent greater than 0.01. Alternatively, iron oxide may be present in the glass composition at a weight percent greater than 0.05. Further alternatively, iron oxide may be present in the glass composition at a weight percent greater than 0.1.

Titanium oxide ($TiO_2$) may be present in the glass composition and fibers of the present invention but is not essential. In one embodiment, the weight percent of titanium oxide is less than 0.50. Alternatively, the weight percent of titanium oxide is no more than 0.45. Further alternatively, the weight percent of titanium oxide is no more than 0.40. Having 0.50 weight percent or more titanium oxide leads to an increased tendency towards phase separation in the glass composition and fibers, especially when combined with phosphorous pentoxide. Titanium oxide may be introduced as an impurity with other raw materials. Titanium oxide typically acts as a viscosity reducer and may be intentionally added or present as an impurity from conventional raw material. Thus, titanium oxide may be present in the glass composition at a weight percent greater than 0.01. Alternatively, titanium oxide may be present in the glass composition at a weight percent greater than 0.05. Further alternatively, titanium oxide may be present in the glass composition at a weight percent greater than 0.1.

Additional oxides may be present in the glass fibers and compositions of the present invention without departing from the scope thereof. For example, oxides, such as manganese oxide ($Mn_2O_3$), zirconium oxide ($ZrO_2$), tin oxide ($SnO_2$), sodium oxide ($Na_2O$), potassium oxide ($K_2O$), lithium oxide ($Li_2O$), zinc oxide (ZnO), strontium oxide (SrO), barium oxide (BaO), chromium oxide ($Cr_2O_3$), lanthanum oxide ($La_2O_3$), vanadium oxide ($V_2O_3$), and/or yttrium oxide ($Y_2O_3$) may be present. Typically, these oxides are present as trace impurities with other raw material components and therefore are often not intentionally added components. Preferably, additional oxides are each present at a weight percent that does not alter the function of the glass, such as less than 1 weight percent. Alternatively, additional oxides are each present at a weight percent less than 0.5. Further alternatively, additional oxides are each present at a weight percent less than 0.1. Moreover, the combined total of these additional oxides is preferably less than 3 weight percent of the total composition. Alternatively, the combined total of these additional oxides may be less than 2 weight percent of the total composition. Further alternatively, the combined total of these additional oxides may be less than 1.5 weight percent of the total composition. Yet further alternatively, the combined total of these additional oxides may be less than 1.0 weight percent of the total composition. Moreover, because of the increased density that results from incorporating amounts of BaO, SrO, ZnO, $K_2O$, $Y_2O_3$, $La_2O_3$, or $V_2O_3$, the composition preferably contains less than 0.5 weight percent of these metal oxides. More preferably, the composition contains less than 0.1 weight percent of these metal oxides. Even more preferably, the composition contains less than 0.05 weight percent of these metal oxides. Because of the profound impacts even minor amounts of alkali metal oxides can have on a glass composition, the combined total of alkali metal oxides, such as $Na_2O$, $K_2O$, and $Li_2O$, is preferably less than 0.5 total weight percent of the composition. More preferably, the combined total is less than 0.25 total weight percent of the composition. Even more preferably, the combined total is less than 0.2 total weight percent of the composition.

Example glass compositions and glass fibers of the present invention are set forth herein. In one embodiment, the glass composition and/or glass fiber includes between 45.0 to 58.0 weight percent $SiO_2$; greater than 18.0 weight percent $B_2O_3$ and no more than 26.0 weight percent $B_2O_3$; greater than 16.0 weight percent $Al_2O_3$ and no more than 23.0 weight percent $Al_2O_3$; between 0.25 to 12.0 weight percent $P_2O_5$; greater than 0.25 weight percent CaO and less than 5.0 weight percent CaO; less than 4.50 weight percent MgO; greater than 0.25 weight percent CaO+MgO and less than 5.0 weight percent CaO+MgO; less than 0.80 weight percent $Fe_2O_3$; and less than 0.50 weight percent $TiO_2$. An alternative glass composition and/or glass fiber of the present invention may include between 45.5 to 57.5 weight percent $SiO_2$; between 18.5 to 25.0 weight percent $B_2O_3$; greater than 16.0 weight percent $Al_2O_3$ and no more than 22.50 weight percent $Al_2O_3$; between 0.25 to 11.0 weight percent $P_2O_5$; greater than 0.25 weight percent CaO and less than 4.5 weight percent CaO; less than 4.25 weight percent MgO; greater than 0.25 weight percent CaO+MgO and less than 4.5 weight percent CaO+MgO; less than 0.70 weight percent $Fe_2O_3$; and less than 0.45 weight percent $TiO_2$. In yet a further alternative glass composition and/or glass fiber of the present invention, the following constituents may be included: between 46.0 to 57.0 weight percent $SiO_2$; between 19.0 to 24.0 weight percent $B_2O_3$; greater than 16.0 weight percent $Al_2O_3$ and no more than 22.0 weight percent $Al_2O_3$; between 0.25 to 10.0 weight percent $P_2O_5$; greater than 0.25 weight percent CaO and less than 4.0 weight percent CaO; less than 3.75 weight percent MgO; greater than 0.25 weight percent CaO+MgO and less than 4.0 weight percent CaO+MgO; less than 0.60 weight percent $Fe_2O_3$; and less than 0.40 weight percent $TiO_2$.

The glass composition of the present invention has a liquidus temperature greater than 1100° C. In an alternative embodiment, the glass composition may have a liquidus temperature greater than 1150° C. In yet a further alternative embodiment, the glass composition may have a liquidus temperature greater than 1200° C. Having a liquidus temperature greater than 1100° C., or more preferably greater than 1150° C., is favorable for fiberizing a glass composition according to the present invention.

Further, the glass composition of the present invention may have a T log 3 viscosity temperature greater than 1350° C. Alternatively, the glass composition may have a T log 3 viscosity temperature greater than 1355° C. In yet a further alternative embodiment, the glass composition may have a T log 3 viscosity temperature greater than 1360° C. Having a T log 3 viscosity temperature greater than 1350° C. is favorable for fiberizing a glass composition according to the present invention.

The glass fibers of the present invention may have a dielectric constant less than or equal to 6. Alternatively, the glass fibers may have a dielectric constant less than or equal to 4.60. In a further alternative embodiment, the glass fibers may have a dielectric constant less than or equal to 4.55.

Further, the glass fibers of the present invention may have a dissipation factor less than or equal to $38 \times 10^{-4}$ at a frequency of 10 GHz at room temperature. Alternatively, the glass fibers may have a dissipation factor less than or equal to $30 \times 10^{-4}$ at a frequency of 10 GHz at room temperature. In a further alternative embodiment, the glass fibers of the present invention may have a dissipation factor less than or equal to $25 \times 10^{-4}$ at a frequency of 10 GHz at room temperature.

The glass fibers of the present invention may be incorporated into a fiberglass reinforced article, such as a printed circuit board. Further, the glass fibers of the present invention may be used in connection with products such as woven fabrics, non-woven fabrics, unidirectional fabrics, chopped strands, chopped strand mats, composite materials, and communication signal transport mediums.

The present invention also includes a process for providing continuous, manufacturable low dielectric glass fibers. The process may include the steps of providing a glass composition, such as disclosed herein, to a melting zone of a glass melter; heating the composition to a forming temperature in excess of the liquidus temperature; and continuously fiberizing the molten glass whereby a low dielectric constant and low dissipation factor glass fiber is produced.

As discussed above, the composition of the glass for providing low dielectric constant glass fibers is, at least in part, based on the weight percent of the oxides discussed above as well as the ratios and combined weights of silicon dioxide, aluminum oxide, boron oxide, calcium oxide, magnesium oxide, phosphorus oxide, iron oxide, and/or titanium oxide. In one aspect, the combination of these parameters, in addition to other parameters discussed herein, such as T log 3 viscosity temperature, makes it possible to obtain glass fibers having a low dielectric constant and low dissipation factor as set forth herein.

Having generally described this instant disclosure, a further understanding can be obtained by reference to certain specific examples illustrated below which are provided for purposes of illustration only and are not intended to be all inclusive or limiting unless otherwise specified.

EXAMPLES

Example glass compositions made according to the present invention are set forth below. The particular components and amounts thereof recited in these examples, as well as other conditions and details, should not be construed to unduly limit this invention. In these examples and throughout this description, all percentages, proportions and ratios are by weight (mass) unless otherwise indicated.

Exemplary glass compositions of the present invention are shown in Tables 1-12 below. The liquidus temperature of the example glass compositions is represented as "$T_{liq}$" and the temperature where the glass composition had a viscosity of 1000 poise is represented as "$T_3$" (also referred to as "T log 3" viscosity temperature). The liquidus temperature and $T_3$ temperature of the example glass compositions were measured for some of the glass compositions and calculated for others. Glass fibers were formed using the example compositions and the dielectric constant and dissipation factor was measured for some of the glass fibers and calculated for others. The dielectric constant is represented as the "Dk" value and the dissipation factor is represented as the "Df" value.

TABLE 1

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | $T_{liq}$ (° C.) | $T_3$ (° C.) |
|---|---|---|---|---|---|---|---|---|---|---|---|---|---|---|---|
| 1 | 49.07 | 20.83 | 20.54 | 5.59 | 0.05 | 3.09 | 0.29 | 0.42 | 0.09 | 0.03 | 3.14 | 0.0024 | 4.47 | 1360 | 1354 |
| 2 | 55.14 | 22.73 | 16.63 | 1.04 | 4.02 | 0.26 |  | 0.02 | 0.03 | 0.01 | 4.28 | 0.0021 | 4.49 | 1363 | 1387 |
| 3 | 55.51 | 22.81 | 16.68 | 1.05 | 3.85 | 0.05 | 0.02 | 0.02 |  |  | 3.90 | 0.0018 | 4.46 | 1369 | 1387 |
| 4 | 55.45 | 22.77 | 16.27 | 1.04 | 4.02 | 0.26 |  | 0.02 | 0.03 | 0.01 | 4.28 | 0.0021 | 4.48 | 1358 | 1391 |
| 5 | 55.79 | 22.98 | 16.32 | 1.06 | 3.75 | 0.05 | 0.02 | 0.02 |  |  | 3.79 | 0.0018 | 4.43 | 1368 | 1391 |
| 6 | 56.04 | 22.88 | 16.03 | 1.05 | 3.90 | 0.05 | 0.02 | 0.02 |  |  | 3.95 | 0.0018 | 4.43 | 1360 | 1394 |
| 7 | 56.54 | 22.98 | 16.03 | 0.55 | 3.80 | 0.05 | 0.02 | 0.02 |  |  | 3.84 | 0.0018 | 4.43 | 1373 | 1392 |
| 8 | 56.55 | 22.94 | 16.01 |  | 4.05 | 0.26 |  | 0.02 | 0.03 | 0.01 | 4.32 | 0.0021 | 4.49 | 1374 | 1387 |
| 9 | 54.52 | 22.66 | 17.33 | 1.04 | 4.00 | 0.26 |  | 0.02 | 0.03 | 0.01 | 4.26 | 0.0022 | 4.52 | 1372 | 1379 |
| 10 | 54.83 | 22.70 | 16.98 | 1.04 | 4.01 | 0.26 |  | 0.02 | 0.03 | 0.01 | 4.27 | 0.0021 | 4.51 | 1367 | 1383 |

TABLE 2

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | $T_{liq}$ (° C.) | $T_3$ (° C.) |
|---|---|---|---|---|---|---|---|---|---|---|---|---|---|---|---|
| 11 | 56.08 | 21.90 | 16.02 | 1.04 | 4.05 | 0.24 | 0.20 | 0.28 | 0.03 | 0.02 | 4.29 | 0.0022 | 4.50 | 1354 | 1398 |
| 12 | 56.23 | 22.09 | 16.01 | 1.05 | 3.70 | 0.05 | 0.38 | 0.49 |  |  | 3.74 | 0.0020 | 4.46 | 1366 | 1399 |
| 13 | 56.85 | 22.03 | 16.11 | 0.02 | 4.07 | 0.24 | 0.20 | 0.28 | 0.03 | 0.02 | 4.32 | 0.0022 | 4.52 | 1375 | 1390 |
| 14 | 56.96 | 22.05 | 16.11 |  | 3.95 |  | 0.40 | 0.52 |  |  | 3.95 | 0.0021 | 4.50 | 1379 | 1390 |
| 15 | 56.36 | 22.00 | 16.09 | 1.05 | 4.07 | 0.20 | 0.02 | 0.02 | 0.01 |  | 4.27 | 0.0020 | 4.47 | 1354 | 1396 |
| 16 | 56.74 | 22.31 | 16.14 | 1.06 | 3.65 | 0.05 | 0.02 | 0.02 |  |  | 3.69 | 0.0017 | 4.41 | 1369 | 1398 |
| 17 | 52.44 | 21.51 | 16.31 | 5.38 | 3.50 | 0.21 | 0.20 | 0.29 | 0.01 | 0.02 | 3.70 | 0.0019 | 4.39 | 1289 | 1424 |
| 18 | 54.14 | 21.80 | 16.53 | 3.12 | 3.55 | 0.21 | 0.20 | 0.29 | 0.01 | 0.02 | 3.75 | 0.0021 | 4.44 | 1336 | 1407 |
| 19 | 56.44 | 22.19 | 16.83 | 0.04 | 3.61 | 0.21 | 0.21 | 0.30 | 0.02 | 0.02 | 3.82 | 0.0022 | 4.50 | 1398 | 1385 |
| 20 | 51.31 | 21.31 | 16.17 | 6.90 | 3.47 | 0.20 | 0.20 | 0.28 | 0.01 | 0.02 | 3.67 | 0.0019 | 4.36 |  | 1435 |

TABLE 3

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 21 | 55.24 | 22.05 | 16.73 | 2.03 | 3.59 | 0.17 | 0.02 | 0.02 | 0.01 | | 3.76 | 0.0019 | 4.44 | 1359 | 1398 |
| 22 | 55.30 | 21.96 | 16.65 | 2.11 | 3.54 | 0.20 | 0.03 | 0.03 | 0.01 | | 3.74 | 0.0019 | 4.43 | 1358 | 1400 |
| 23 | 54.13 | 23.08 | 16.68 | 2.14 | 3.54 | 0.24 | | 0.02 | 0.05 | 0.01 | 3.78 | 0.0020 | 4.44 | 1356 | 1394 |
| 24 | 52.64 | 22.94 | 17.25 | 3.14 | 3.51 | 0.24 | 0.01 | 0.03 | 0.11 | 0.02 | 3.75 | 0.0021 | 4.45 | 1341 | 1393 |
| 25 | 54.06 | 22.74 | 17.34 | 1.95 | 3.48 | 0.24 | 0.01 | 0.02 | 0.04 | 0.01 | 3.72 | 0.0021 | 4.46 | 1377 | 1387 |
| 26 | 52.45 | 22.85 | 17.00 | 3.90 | 3.44 | 0.23 | | 0.02 | | 0.01 | 3.67 | 0.0019 | 4.41 | 1330 | 1401 |
| 27 | 50.93 | 20.10 | 16.78 | 8.14 | 3.09 | 0.24 | 0.19 | 0.30 | 0.11 | 0.02 | 3.33 | 0.0019 | 4.34 | 1348 | 1453 |
| 28 | 52.03 | 26.34 | 17.28 | 0.92 | 3.05 | 0.20 | | 0.02 | 0.04 | 0.01 | 3.26 | 0.0021 | 4.43 | 1406 | 1366 |
| 29 | 53.95 | 22.72 | 17.25 | 2.44 | 3.26 | 0.23 | 0.01 | 0.02 | | 0.01 | 3.49 | 0.0020 | 4.42 | 1374 | 1393 |
| 30 | 52.30 | 22.68 | 16.98 | 4.43 | 3.21 | 0.22 | 0.01 | 0.02 | 0.04 | 0.01 | 3.44 | 0.0019 | 4.38 | 1327 | 1407 |

TABLE 4

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 31 | 50.91 | 21.47 | 16.85 | 6.92 | 3.03 | 0.18 | 0.21 | 0.30 | | 0.02 | 3.21 | 0.0019 | 4.35 | 1293 | 1437 |
| 32 | 55.19 | 22.32 | 17.27 | 0.99 | 3.08 | 0.22 | 0.29 | 0.42 | 0.08 | 0.03 | 3.30 | 0.0022 | 4.47 | 1404 | 1387 |
| 33 | 53.44 | 21.90 | 17.20 | 3.54 | 3.09 | 0.17 | 0.21 | 0.30 | 0.02 | 0.02 | 3.26 | 0.0020 | 4.41 | 1352 | 1405 |
| 34 | 52.37 | 21.71 | 17.05 | 4.98 | 3.06 | 0.17 | 0.21 | 0.30 | 0.02 | 0.02 | 3.23 | 0.0019 | 4.38 | 1322 | 1415 |
| 35 | 52.71 | 19.88 | 17.12 | 7.35 | 0.05 | 2.32 | 0.21 | 0.31 | 0.03 | 0.02 | 2.37 | | 4.22 | 1291 | 1456 |
| 36 | 55.66 | 22.36 | 17.55 | 0.95 | 3.15 | 0.15 | 0.02 | 0.02 | 0.01 | | 3.30 | 0.0019 | 4.44 | 1405 | 1385 |
| 37 | 53.53 | 22.98 | 17.13 | 2.95 | 3.05 | 0.19 | 0.01 | 0.03 | 0.03 | 0.01 | 3.24 | 0.0021 | 4.46 | 1367 | 1397 |
| 38 | 54.14 | 22.09 | 17.35 | 3.00 | 3.11 | 0.14 | 0.02 | 0.02 | 0.01 | | 3.25 | 0.0018 | 4.40 | 1363 | 1399 |
| 39 | 55.60 | 21.56 | 17.54 | 0.95 | 3.14 | 0.14 | 0.41 | 0.53 | 0.01 | | 3.28 | 0.0022 | 4.49 | 1405 | 1388 |
| 40 | 52.64 | 21.82 | 17.15 | 5.01 | 3.07 | 0.14 | 0.02 | 0.02 | 0.01 | | 3.21 | 0.0017 | 4.36 | 1322 | 1414 |

TABLE 5

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 41 | 51.92 | 22.94 | 16.88 | 4.91 | 2.99 | 0.19 | 0.01 | 0.03 | 0.03 | 0.01 | 3.19 | 0.0018 | 4.34 | 1323 | 1406 |
| 42 | 55.16 | 22.16 | 17.40 | 0.94 | 3.12 | 0.14 | 0.41 | 0.53 | 0.01 | | 3.26 | 0.0022 | 4.48 | 1404 | 1386 |
| 43 | 53.82 | 21.95 | 17.24 | 2.99 | 3.09 | 0.13 | 0.28 | 0.38 | 0.01 | 0.01 | 3.23 | 0.0020 | 4.43 | 1363 | 1401 |
| 44 | 54.73 | 22.76 | 17.26 | 0.94 | 3.09 | 0.14 | 0.41 | 0.53 | 0.01 | | 3.23 | 0.0022 | 4.47 | 1404 | 1385 |
| 45 | 55.32 | 22.21 | 17.44 | 0.93 | 3.13 | 0.11 | 0.32 | 0.42 | 0.01 | | 3.24 | 0.0021 | 4.47 | 1405 | 1386 |
| 46 | 53.56 | 22.99 | 17.14 | 2.95 | 3.05 | 0.14 | 0.02 | 0.02 | 0.01 | | 3.19 | 0.0018 | 4.39 | 1370 | 1397 |
| 47 | 51.95 | 22.95 | 16.88 | 4.91 | 3.00 | 0.14 | 0.02 | 0.02 | 0.01 | | 3.14 | 0.0017 | 4.34 | 1312 | 1411 |
| 48 | 52.29 | 20.08 | 16.89 | 7.41 | 1.49 | 1.19 | 0.21 | 0.31 | 0.06 | 0.01 | 2.68 | | 4.26 | 1312 | 1447 |
| 49 | 50.64 | 21.38 | 17.51 | 7.04 | 2.61 | 0.16 | 0.22 | 0.31 | 0.01 | 0.02 | 2.77 | 0.0018 | 4.33 | | 1427 |
| 50 | 52.75 | 21.75 | 17.81 | 4.23 | 2.66 | 0.16 | 0.22 | 0.31 | 0.01 | 0.02 | 2.82 | 0.0020 | 4.38 | 1360 | 1405 |

TABLE 6

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 51 | 54.20 | 22.59 | 17.78 | 1.68 | 2.65 | 0.18 | 0.30 | 0.42 | 0.08 | 0.03 | 2.83 | 0.0023 | 4.44 | 1417 | 1388 |
| 52 | 54.97 | 22.20 | 18.18 | 1.68 | 2.71 | 0.12 | 0.02 | 0.02 | | | 2.83 | 0.0019 | 4.41 | 1413 | 1385 |
| 53 | 54.47 | 22.00 | 18.01 | 1.66 | 2.69 | 0.12 | 0.41 | 0.54 | | | 2.81 | 0.0022 | 4.45 | 1412 | 1387 |
| 54 | 54.60 | 22.05 | 18.06 | 1.65 | 2.70 | 0.10 | 0.33 | 0.43 | | | 2.79 | 0.0021 | 4.44 | 1413 | 1386 |
| 55 | 52.93 | 19.44 | 17.92 | 6.36 | 2.39 | 0.17 | 0.23 | 0.35 | 0.11 | 0.02 | 2.56 | 0.0018 | 4.30 | 1333 | 1431 |
| 56 | 56.02 | 19.91 | 18.36 | 2.28 | 2.45 | 0.17 | 0.24 | 0.36 | 0.11 | 0.02 | 2.63 | 0.0021 | 4.42 | 1412 | 1401 |
| 57 | 51.18 | 20.81 | 17.96 | 7.49 | 2.30 | 0.15 | 0.01 | 0.02 | | 0.01 | 2.45 | 0.0016 | 4.27 | 1332 | 1431 |
| 58 | 50.38 | 21.30 | 18.17 | 7.15 | 2.21 | 0.13 | 0.23 | 0.32 | 0.02 | 0.02 | 2.34 | 0.0017 | 4.23 | 1338 | 1431 |
| 59 | 52.04 | 21.59 | 18.41 | 4.91 | 2.24 | 0.13 | 0.23 | 0.32 | 0.02 | 0.02 | 2.37 | 0.0019 | 4.36 | 1368 | 1406 |
| 60 | 53.77 | 22.16 | 18.47 | 2.38 | 2.20 | 0.16 | 0.29 | 0.43 | 0.06 | 0.02 | 2.36 | 0.0022 | 4.40 | 1426 | 1380 |

TABLE 7

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 61 | 54.26 | 22.04 | 18.81 | 2.38 | 2.28 | 0.10 | 0.02 | 0.02 | | | 2.38 | 0.0018 | 4.38 | 1422 | 1386 |
| 62 | 53.77 | 21.84 | 18.63 | 2.36 | 2.26 | 0.09 | 0.41 | 0.54 | | | 2.36 | 0.0021 | 4.42 | 1421 | 1388 |
| 63 | 53.88 | 21.89 | 18.67 | 2.37 | 2.27 | 0.08 | 0.34 | 0.44 | | | 2.35 | 0.0020 | 4.41 | 1421 | 1387 |
| 64 | 50.10 | 21.22 | 18.81 | 7.28 | 1.82 | 0.11 | 0.24 | 0.33 | 0.02 | 0.02 | 1.93 | 0.0018 | 4.29 | 1339 | 1420 |

TABLE 7-continued

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 65 | 51.35 | 21.44 | 19.00 | 5.59 | 1.84 | 0.11 | 0.24 | 0.34 | 0.03 | 0.02 | 1.95 | 0.0019 | 4.33 | 1375 | 1407 |
| 66 | 53.55 | 21.90 | 19.40 | 3.09 | 1.88 | 0.08 | 0.02 | 0.02 |  |  | 1.95 | 0.0017 | 4.35 | 1429 | 1387 |
| 67 | 53.05 | 22.05 | 19.02 | 3.06 | 1.80 | 0.13 | 0.30 | 0.43 | 0.08 | 0.03 | 1.93 | 0.0022 | 4.39 | 1433 | 1390 |
| 68 | 53.06 | 21.70 | 19.22 | 3.07 | 1.86 | 0.07 | 0.42 | 0.54 |  |  | 1.93 | 0.0021 | 4.39 | 1428 | 1389 |
| 69 | 53.16 | 21.74 | 19.26 | 3.07 | 1.86 | 0.06 | 0.34 | 0.45 |  |  | 1.92 | 0.0020 | 4.38 | 1429 | 1388 |
| 70 | 48.62 | 20.30 | 19.35 | 9.43 | 1.48 | 0.09 | 0.23 | 0.33 | 0.09 | 0.02 | 1.57 | 0.0017 | 4.25 | 1395 | 1434 |

TABLE 8

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 71 | 50.20 | 20.73 | 19.35 | 7.81 | 0.01 | 1.12 | 0.34 | 0.44 |  |  | 1.13 | 0.0019 | 4.21 | 1368 | 1432 |
| 72 | 49.82 | 21.15 | 19.44 | 7.38 | 1.44 | 0.09 | 0.25 | 0.35 | 0.03 | 0.02 | 1.53 | 0.0018 | 4.28 | 1364 | 1424 |
| 73 | 50.65 | 21.29 | 19.57 | 6.27 | 1.45 | 0.09 | 0.25 | 0.35 | 0.03 | 0.02 | 1.54 | 0.0018 | 4.30 | 1383 | 1408 |
| 74 | 52.49 | 21.60 | 19.86 | 3.78 | 1.47 | 0.09 | 0.25 | 0.36 | 0.03 | 0.02 | 1.56 | 0.0019 | 4.36 | 1436 | 1389 |
| 75 | 50.08 | 20.68 | 19.32 | 7.80 | 0.78 | 0.56 | 0.34 | 0.44 |  |  | 1.34 |  | 4.24 | 1366 | 1428 |
| 76 | 46.59 | 20.28 | 21.70 | 10.60 | 0.06 | 0.02 | 0.25 | 0.37 | 0.11 | 0.02 | 0.08 | 0.0016 | 4.18 | 1409 | 1414 |
| 77 | 52.27 | 19.12 | 21.98 | 5.74 | 0.01 | 0.03 | 0.32 | 0.46 | 0.07 |  | 0.04 | 0.0017 | 4.29 | 1467 | 1404 |
| 78 | 48.84 | 20.51 | 21.98 | 7.88 | 0.01 | 0.02 | 0.29 | 0.40 | 0.04 | 0.02 | 0.03 | 0.0017 | 4.23 | 1427 | 1407 |
| 79 | 49.02 | 21.17 | 21.57 | 8.18 | 0.03 |  | 0.01 | 0.02 |  |  | 0.03 | 0.0014 | 4.18 | 1421 | 1408 |
| 80 | 51.72 | 19.88 | 21.62 | 5.89 | 0.03 |  | 0.31 | 0.44 | 0.08 | 0.03 | 0.03 | 0.0018 | 4.26 | 1467 | 1401 |

TABLE 9

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 81 | 48.70 | 20.52 | 21.73 | 8.26 | 0.02 |  | 0.28 | 0.40 | 0.08 | 0.02 | 0.02 | 0.0017 | 4.22 | 1420 | 1409 |
| 82 | 50.85 | 21.48 | 18.78 | 8.25 | 0.02 |  | 0.23 | 0.33 | 0.03 | 0.02 | 0.02 | 0.0013 | 4.12 | 1379 | 1442 |
| 83 | 52.51 | 21.77 | 19.03 | 6.05 | 0.02 |  | 0.23 | 0.33 | 0.03 | 0.02 | 0.02 | 0.0014 | 4.12 | 1431 | 1424 |
| 84 | 54.39 | 22.09 | 19.32 | 3.56 | 0.02 |  | 0.24 | 0.34 | 0.03 | 0.02 | 0.02 | 0.0015 | 4.18 | 1484 | 1405 |
| 85 | 56.32 | 22.43 | 19.61 | 0.99 | 0.02 |  | 0.24 | 0.34 | 0.03 | 0.02 | 0.02 | 0.0017 | 4.23 | 1537 | 1386 |
| 86 | 47.99 | 21.39 | 19.29 | 10.67 |  |  | 0.32 | 0.37 |  |  |  | 0.0014 | 4.10 | 1389 | 1441 |
| 87 | 50.98 | 20.77 | 19.15 | 8.36 |  |  | 0.32 | 0.42 |  |  |  | 0.0014 | 4.10 | 1389 | 1441 |
| 88 | 51.15 | 21.61 | 18.89 | 8.31 |  |  | 0.02 | 0.02 |  |  |  | 0.0011 | 4.05 | 1383 | 1440 |
| 89 | 52.82 | 21.90 | 19.15 | 6.09 |  |  | 0.02 | 0.02 |  |  |  | 0.0012 | 4.09 | 1432 | 1423 |
| 90 | 54.72 | 22.22 | 19.43 | 3.58 |  |  | 0.02 | 0.02 |  |  |  | 0.0013 | 4.15 | 1485 | 1404 |

TABLE 10

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 91 | 56.67 | 22.56 | 19.74 | 1.00 |  |  | 0.02 | 0.02 |  |  |  | 0.0015 | 4.20 | 1539 | 1385 |
| 92 | 50.85 | 24.71 | 16.82 | 3.95 | 3.30 | 0.04 | 0.01 | 0.02 | 0.02 | 0.01 | 3.34 | 0.0019 | 4.34 | 1340 | 1378 |
| 93 | 51.34 | 24.08 | 16.99 | 3.97 | 3.26 | 0.04 | 0.01 | 0.03 | 0.02 | 0.01 | 3.30 | 0.0019 | 4.33 | 1344 | 1385 |
| 94 | 51.97 | 23.00 | 17.33 | 4.02 | 3.35 | 0.04 | 0.01 | 0.03 | 0.02 | 0.01 | 3.39 | 0.0020 | 4.37 | 1348 | 1394 |
| 95 | 50.71 | 24.20 | 16.77 | 3.94 | 2.97 | 0.21 | 0.27 | 0.46 | 0.12 | 0.03 | 3.18 | 0.0022 | 4.36 | 1336 | 1371 |
| 96 | 51.33 | 22.93 | 17.78 | 4.12 | 3.45 | 0.03 | 0.01 | 0.03 | 0.03 | 0.01 | 3.48 | 0.0020 | 4.41 | 1353 | 1385 |
| 97 | 51.93 | 23.03 | 16.64 | 4.03 | 2.98 | 0.23 | 0.27 | 0.42 | 0.11 | 0.03 | 3.21 | 0.0021 | 4.39 | 1330 | 1391 |
| 98 | 51.59 | 23.21 | 17.33 | 3.93 | 3.55 | 0.03 | 0.02 | 0.04 | 0.03 | 0.01 | 3.58 | 0.0020 | 4.41 | 1345 | 1387 |
| 99 | 51.54 | 23.12 | 16.97 | 4.01 | 3.31 | 0.04 | 0.26 | 0.37 | 0.09 | 0.02 | 3.35 | 0.0021 | 4.40 | 1342 | 1385 |
| 100 | 51.84 | 23.59 | 16.97 | 3.94 | 3.29 | 0.03 | 0.01 | 0.03 | 0.03 | 0.01 | 3.32 | 0.0019 | 4.38 | 1344 | 1392 |

TABLE 11

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 101 | 51.82 | 23.39 | 16.51 | 3.96 | 3.23 | 0.04 | 0.27 | 0.41 | 0.10 | 0.03 | 3.26 | 0.0021 | 4.38 | 1336 | 1389 |
| 102 | 51.80 | 23.76 | 16.87 | 3.95 | 3.28 | 0.02 | 0.01 | 0.03 | 0.03 | 0.01 | 3.30 | 0.0018 | 4.38 | 1343 | 1392 |
| 103 | 51.17 | 23.75 | 17.14 | 4.02 | 3.30 | 0.03 | 0.11 | 0.17 | 0.05 | 0.02 | 3.33 | 0.0020 | 4.39 | 1346 | 1382 |
| 104 | 51.09 | 23.99 | 17.22 | 3.98 | 3.35 | 0.02 | 0.01 | 0.03 | 0.02 | 0.01 | 3.37 | 0.0019 | 4.39 | 1348 | 1381 |
| 105 | 51.29 | 23.99 | 16.44 | 3.94 | 3.23 | 0.04 | 0.27 | 0.41 | 0.10 | 0.03 | 3.27 | 0.0021 | 4.38 | 1334 | 1382 |
| 106 | 50.76 | 24.25 | 17.19 | 4.02 | 3.40 | 0.02 | 0.01 | 0.03 | 0.02 | 0.01 | 3.42 | 0.0019 | 4.39 | 1345 | 1377 |
| 107 | 50.86 | 24.29 | 16.55 | 3.96 | 2.96 | 0.21 | 0.28 | 0.42 | 0.10 | 0.03 | 3.17 | 0.0021 | 4.39 | 1331 | 1374 |
| 108 | 50.79 | 24.51 | 17.03 | 3.98 | 3.33 | 0.02 | 0.01 | 0.03 | 0.03 | 0.01 | 3.35 | 0.0019 | 4.39 | 1345 | 1377 |

TABLE 11-continued

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 109 | 50.70 | 24.45 | 16.53 | 3.98 | 2.98 | 0.20 | 0.27 | 0.42 | 0.10 | 0.03 | 3.18 | 0.0021 | 4.39 | 1331 | 1373 |
| 110 | 50.91 | 24.78 | 16.80 | 3.93 | 3.29 | 0.04 | 0.01 | 0.03 | 0.02 | 0.01 | 3.33 | 0.0018 | 4.38 | 1340 | 1379 |

TABLE 12

| Example # | SiO$_2$ | B$_2$O$_3$ | Al$_2$O$_3$ | P$_2$O$_5$ | CaO | MgO | TiO$_2$ | Fe$_2$O$_3$ | Na$_2$O | K$_2$O | CaO + MgO | Df @ 10 GHz | Dk @ 10 GHz | T$_{liq}$ (° C.) | T$_3$ (° C.) |
|---|---|---|---|---|---|---|---|---|---|---|---|---|---|---|---|
| 111 | 50.37 | 24.73 | 16.58 | 3.98 | 2.98 | 0.20 | 0.27 | 0.42 | 0.10 | 0.03 | 3.18 | 0.0021 | 4.39 | 1332 | 1367 |
| 112 | 50.55 | 24.86 | 16.78 | 3.96 | 3.47 | 0.03 | 0.01 | 0.03 | 0.02 | 0.01 | 3.50 | 0.0019 | 4.39 | 1336 | 1374 |
| 113 | 50.25 | 24.99 | 16.37 | 4.03 | 3.01 | 0.21 | 0.27 | 0.41 | 0.10 | 0.03 | 3.22 | 0.0021 | 4.39 | 1325 | 1367 |
| 114 | 51.21 | 24.02 | 16.95 | 3.96 | 3.50 | 0.04 | 0.01 | 0.03 | 0.02 | 0.01 | 3.54 | 0.0019 | 4.40 | 1337 | 1383 |
| 115 | 51.08 | 23.96 | 16.90 | 3.95 | 3.75 | 0.04 | 0.01 | 0.03 | 0.02 | 0.01 | 3.79 | 0.0019 | 4.41 | 1330 | 1381 |
| 116 | 50.95 | 23.90 | 16.86 | 3.94 | 4.00 | 0.04 | 0.01 | 0.03 | 0.02 | 0.01 | 4.04 | 0.0020 | 4.42 | 1323 | 1378 |
| 117 | 50.81 | 23.83 | 16.82 | 3.93 | 4.25 | 0.04 | 0.01 | 0.03 | 0.02 | 0.01 | 4.29 | 0.0020 | 4.44 | | 1376 |
| 118 | 50.68 | 23.77 | 16.77 | 3.92 | 4.50 | 0.04 | 0.01 | 0.03 | 0.02 | 0.01 | 4.54 | 0.0021 | 4.45 | | 1374 |
| 119 | 50.55 | 23.71 | 16.73 | 3.91 | 4.75 | 0.04 | 0.01 | 0.03 | 0.02 | 0.01 | 4.79 | 0.0021 | 4.46 | | 1371 |
| 120 | 50.42 | 23.65 | 16.68 | 3.90 | 5.00 | 0.04 | 0.01 | 0.03 | 0.02 | 0.01 | 5.04 | 0.0022 | 4.48 | | 1369 |

Batches having the sample glass compositions shown in Table 1-12 were prepared as described below. Glass synthesis included batch pre-treatment (mechanical and thermal), a first melting, fritting in water or crushing, a second melting, and, finally, pouring the glass into graphite molds.

Glass specimens were tested for crystallization potential (liquidus temperature) according to ASTM C 829-81.

The T log 3 viscosity temperature was measured using ASTM C 965-81.

Measurements of dielectric characteristics at 10 GHz were performed using the Split Post Dielectric Resonator method, also referred to in the art as the SPDR test.

As shown in Tables 1-12, at 10 GHz, the glass compositions in the examples have a dielectric constant less than 4.52, and a dissipation factor of less than or equal to 24×10$^{-4}$. Specifically, at 10 GHz, the dielectric constant is 4.05 to 4.52, and the dissipation factor is 11×10$^{-4}$ to 24×10$^{-4}$. Accordingly, the glass compositions in the examples exhibited a low dielectric constant and low dissipation factor less than the dielectric properties of E-glass.

The density and Young's modulus were measured for Example 80 in Table 8, Example 81 in Table 9, and Examples 92-95 in Table 10. Young's modulus was measured using ASTM C 623-92 and density was measured according to ASTM C 693-93. The Young's modulus and density measurements of such examples are set forth in Table 13 below.

Furthermore, the glass compositions in the examples exhibited T log 3 viscosity temperatures between 1356° C. to 1456° C., which is similar to typical T log 3 viscosity temperatures of D-glass (around 1400° C.). Having a T log 3 viscosity temperature greater than 1350° C. is favorable for fiberizing a glass composition according to the present invention. Thus, the glass composition according to the examples and according to this invention must be greater than 1350° C.

Additionally, the glass compositions in the examples exhibited a liquidus temperature between 1289° C. to 1539° C. Having a liquidus temperature greater than 1100° C., or more preferably greater than 1150° C. is favorable for fiberizing a glass composition according to the present invention. Thus, the glass composition according to the examples and according to this invention must be greater than 1100° C.

INDUSTRIAL APPLICABILITY

The glass fibers of the present invention have low dielectric constants and low dissipation factors and are excellent as a glass fiber for printed wiring boards. The glass fibers are particularly well suited for reinforcing printed wiring boards for high-density circuits used in high speed routing systems.

TABLE 13

| Example # | SiO$_2$ | B$_2$O$_3$ | Al$_2$O$_3$ | CaO | P$_2$O$_5$ | MgO | TiO$_2$ | Fe$_2$O$_3$ | Na$_2$O | K$_2$O | CaO + MgO | Density (g/cm$^3$) | Young's Modulus (GPa) |
|---|---|---|---|---|---|---|---|---|---|---|---|---|---|
| 80 | 51.72 | 19.88 | 21.62 | 0.03 | 5.89 | | 0.31 | 0.44 | 0.08 | 0.03 | 0.03 | 2.25 | 59.6 |
| 81 | 48.70 | 20.52 | 21.73 | 0.02 | 8.26 | | 0.28 | 0.40 | 0.08 | 0.02 | 0.02 | 2.24 | 58.4 |
| 92 | 50.85 | 24.71 | 16.82 | 3.30 | 3.95 | 0.04 | 0.01 | 0.02 | 0.02 | 0.01 | 3.34 | 2.23 | 55.0 |
| 93 | 51.34 | 24.08 | 16.99 | 3.26 | 3.97 | 0.04 | 0.01 | 0.03 | 0.02 | 0.01 | 3.30 | 2.23 | 55.5 |
| 94 | 51.97 | 23.00 | 17.33 | 3.35 | 4.02 | 0.04 | 0.01 | 0.03 | 0.02 | 0.01 | 3.39 | 2.24 | 56.9 |
| 95 | 50.71 | 24.20 | 16.77 | 2.97 | 3.94 | 0.21 | 0.27 | 0.46 | 0.12 | 0.03 | 3.18 | 2.24 | 56.6 |

The measured Young's modulus for the above examples ranged from 55.0 to 59.6 GPa and the measured density for the above examples ranged from 2.23 to 2.25 g/cm$^3$.

Furthermore, the glass compositions used to make fibers of the present invention have excellent workability. Therefore, a stable low dielectric glass fiber can be readily produced.

A variety of base materials containing the glass fiber of the present invention can be produced, including, but not limited to, woven fabrics, non-woven fabrics, unidirectional fabrics, knitted products, chopped strand, roving, filament wound products, glass powder, and mats. Composite materials formed from at least one of these base materials and a plastic resin matrix (such as thermoset plastic, compounded thermoplastic, a sheet molding compound, a bulk molding compound, or a prepeg) also can be used as reinforcements for peripheral communication devices, and the like. For example, a composite material that includes glass fibers according to the invention can be used in radar transparency applications at frequencies ranging from about 300 MHz to about 30 GHz.

The disclosed and described processes relate to glass fibers, which can be obtained by mechanically attenuating streams of molten glass that flow out of orifices located in the base of a bushing, which is heated by resistance heating or other means. These glass fibers may be intended especially for the production of meshes and fabrics used in composites having an organic and/or inorganic matrix.

As required, detailed embodiments of the present invention are disclosed herein; however, it is to be understood that the disclosed embodiments are merely exemplary of the invention that may be embodied in various and alternative forms. Therefore, specific structural and functional details disclosed herein are not to be interpreted as limiting, but merely as a basis for the claims and as a representative basis for teaching one skilled in the art to variously employ the present invention. It will be apparent to those skilled in the art that many changes and substitutions may be made to the foregoing description of preferred embodiments and examples without departing from the spirit and scope of the present invention, which is defined by the appended claims.

While various embodiments and examples of this invention have been described above, these descriptions are given for purposes of illustration and explanation. Variations, changes, modifications, and departures from the embodiments, systems, and methods disclosed above may be adopted without departure from the spirit and scope of this invention.

What is claimed is:

1. A glass composition comprising:
   between 45.0 to 58.0 weight percent $SiO_2$;
   greater than 18.0 weight percent $B_2O_3$ and no more than 26.0 weight percent $B_2O_3$;
   greater than 16.0 weight percent $Al_2O_3$ and no more than 23.0 weight percent $Al_2O_3$;
   between 0.25 to 12.0 weight percent $P_2O_5$;
   greater than 0.25 weight percent CaO and less than 5.00 weight percent CaO;
   less than 4.50 weight percent MgO;
   greater than 0.25 weight percent CaO+MgO and less than 5.00 weight percent CaO+MgO;
   less than 0.80 weight percent $Fe_2O_3$; and
   less than 0.50 weight percent $TiO_2$;
   wherein the composition has a glass viscosity of 1000 poise at a temperature greater than 1350° C.

2. The glass composition of claim 1, wherein the class composition further comprises:
   between 45.5 to 57.5 weight percent $SiO_2$;
   between 18.5 to 25.0 weight percent $B_2O_3$;
   greater than 16.0 weight percent $Al_2O_3$ and no more than 22.50 weight percent $Al_2O_3$;
   between 0.25 to 11.0 weight percent $P_2O_5$;
   greater than 0.25 weight percent CaO and less than 4.5 weight percent CaO;
   less than 4.25 weight percent MgO;
   greater than 0.25 weight percent CaO+MgO and less than 4.5 weight percent CaO+MgO;
   less than 0.70 weight percent $Fe_2O_3$; and
   less than 0.45 weight percent $TiO_2$.

3. The glass composition of claim 1 wherein the class composition further comprises:
   between 46.0 to 57.0 weight percent $SiO_2$;
   between 19.0 to 24.0 weight percent $B_2O_3$;
   greater than 16.0 weight percent $Al_2O_3$ and no more than 22.0 weight percent $Al_2O_3$;
   between 0.25 to 10.0 weight percent $P_2O_5$;
   greater than 0.25 weight percent CaO and less than 4.0 weight percent CaO;
   less than 3.75 weight percent MgO;
   greater than 0.25 weight percent CaO+MgO and less than 4.0 weight percent CaO+MgO;
   less than 0.60 weight percent $Fe_2O_3$; and
   less than 0.40 weight percent $TiO_2$.

4. The glass composition of claim 1, wherein the composition further comprises one or more of:
   no less than 45.5 weight percent $SiO_2$;
   no more than 57.5 weight percent $SiO_2$;
   no less than 18.5 weight percent $B_2O_3$;
   no more than 25.0 weight percent $B_2O_3$;
   no more than 22.50 weight percent $Al_2O_3$;
   no more than 11.0 weight percent $P_2O_5$;
   less than 4.5 weight percent CaO;
   less than 4.25 weight percent MgO;
   less than 4.5 weight percent CaO+MgO;
   no more than 0.70 weight percent $Fe_2O_3$; and/or
   no more than 0.45 weight percent $TiO_2$.

5. The glass composition of claim 1, wherein the composition further comprises one or more of:
   no less than 46.0 weight percent $SiO_2$;
   no more than 57.0 weight percent $SiO_2$;
   no less than 19.0 weight percent $B_2O_3$;
   no more than 24.0 weight percent $B_2O_3$;
   no more than 22.0 weight percent $Al_2O_3$;
   no more than 10.0 weight percent $P_2O_5$;
   less than 4.0 weight percent CaO;
   less than 3.75 weight percent MgO;
   less than 4.0 weight percent CaO+MgO;
   no more than 0.60 weight percent $Fe_2O_3$; and/or
   no more than 0.4 weight percent $TiO_2$.

6. The glass composition of claim 1 wherein the composition has a liquidus temperature greater than 1100° C.

7. The glass composition of claim 1 wherein the composition has a glass viscosity of 1000 poise at a temperature greater than 1355° C.

8. The glass composition of claim 1 wherein the composition has a glass viscosity of 1000 poise at a temperature greater than 1360° C.

9. A process for providing continuous, manufacturable low dielectric glass fibers, the process comprising the steps of:
   providing the glass composition of claim 1 to a melting zone of a glass melter;
   heating the composition to a forming temperature in excess of the liquidus temperature; and
   continuously fiberizing said molten glass whereby a low dielectric constant and low dissipation factor glass fiber is produced.

10. A glass fiber comprising the glass composition of claim 1.

11. The glass fiber of claim 10, wherein the glass fiber has a dielectric constant less than or equal to 6 and/or a dissipation factor less than or equal to 38×10⁻⁴ at a frequency of 10 GHz at room temperature.

12. A fiberglass reinforced article comprising glass fibers of claim 10.

13. The fiberglass reinforced article of claim 12, wherein the article is a printed circuit board.

14. A low dielectric glass fiber formed from a glass composition comprising:
   between 45.0 to 58.0 weight percent $SiO_2$;
   greater than 18.0 weight percent $B_2O_3$ and no more than 26.0 weight percent $B_2O_3$;
   greater than 16.0 weight percent $Al_2O_3$ and no more than 23.0 weight percent $Al_2O_3$;
   between 0.25 to 12.0 weight percent $P_2O_5$;
   greater than 0.25 weight percent CaO and less than 5.00 weight percent CaO;
   less than 4.50 weight percent MgO;
   greater than 0.25 weight percent CaO+MgO and less than 5.00 weight percent CaO+MgO;
   less than 0.80 weight percent $Fe_2O_3$; and
   less than 0.50 weight percent $TiO_2$;
   wherein the composition has a glass viscosity of 1000 poise at a temperature greater than 1350° C.

15. The low dielectric glass fiber of claim 14, wherein the glass composition further comprises:
   between 45.5 to 57.5 weight percent $SiO_2$;
   between 18.5 to 25.0 weight percent $B_2O_3$;
   greater than 16.0 weight percent $Al_2O_3$ and no more than 22.50 weight percent $Al_2O_3$;
   between 0.25 to 11.0 weight percent $P_2O_5$;
   greater than 0.25 weight percent CaO and less than 4.5 weight percent CaO;
   less than 4.25 weight percent MgO;
   greater than 0.25 weight percent CaO+MgO and less than 4.5 weight percent CaO+MgO;
   less than 0.70 weight percent $Fe_2O_3$; and
   less than 0.45 weight percent $TiO_2$.

16. The low dielectric glass fiber of claim 14, wherein the glass composition further comprises:
   between 46.0 to 57.0 weight percent $SiO_2$;
   between 19.0 to 24.0 weight percent $B_2O_3$;
   greater than 16.0 weight percent $Al_2O_3$ and no more than 22.0 weight percent $Al_2O_3$;
   between 0.25 to 10.0 weight percent $P_2O_5$;
   greater than 0.25 weight percent CaO and less than 4.0 weight percent CaO;
   less than 3.75 weight percent MgO;
   greater than 0.25 weight percent CaO+MgO and less than 4.0 weight percent CaO+MgO;
   less than 0.60 weight percent $Fe_2O_3$; and
   less than 0.40 weight percent $TiO_2$.

17. The low dielectric glass fiber of claim 14, wherein the glass composition further comprises one or more of:
   no less than 45.5 weight percent $SiO_2$;
   no more than 57.5 weight percent $SiO_2$;
   no less than 18.5 weight percent $B_2O_3$;
   no more than 25.0 weight percent $B_2O_3$;
   no more than 22.50 weight percent $Al_2O_3$;
   no more than 11.0 weight percent $P_2O_5$;
   less than 4.5 weight percent CaO;
   less than 4.25 weight percent MgO;
   less than 4.5 weight percent CaO+MgO;
   no more than 0.70 weight percent $Fe_2O_3$; and/or
   no more than 0.45 weight percent $TiO_2$.

18. The low dielectric glass fiber of claim 14, wherein the glass composition further comprises one or more of:
   no less than 46.0 weight percent $SiO_2$;
   no more than 57.0 weight percent $SiO_2$;
   no less than 19.0 weight percent $B_2O_3$;
   no more than 24.0 weight percent $B_2O_3$;
   no more than 22.0 weight percent $Al_2O_3$;
   no more than 10.0 weight percent $P_2O_5$;
   less than 4.0 weight percent CaO;
   less than 3.75 weight percent MgO;
   less than 4.0 weight percent CaO+MgO;
   no more than 0.60 weight percent $Fe_2O_3$; and/or
   no more than 0.4 weight percent $TiO_2$.

19. The glass fiber of claim 14 wherein the glass composition has a liquidus temperature greater than 1100° C.

20. The glass fiber of claim 14 wherein the glass composition has a glass viscosity of 1000 poise at a temperature greater than 1355° C.

21. The glass fiber of claim 14 wherein the glass composition has a glass viscosity of 1000 poise at a temperature greater than 1360° C.

22. The glass fiber of claim 14, wherein the glass fiber has a dielectric constant less than or equal to 6 and/or a dissipation factor less than or equal to 38×10⁻⁴ at a frequency of 10 GHz at room temperature.

23. A product comprising the glass fiber according to claim 14, the product being selected from the group consisting of a printed circuit board, a woven fabric, a nonwoven fabric, a unidirectional fabric, a chopped strand, a chopped strand mat, a composite material, and a communication signal transport medium.

* * * * *

UNITED STATES PATENT AND TRADEMARK OFFICE
CERTIFICATE OF CORRECTION

Page 1 of 1

PATENT NO. : 10,562,810 B2
APPLICATION NO. : 16/474287
DATED : February 18, 2020
INVENTOR(S) : Robert Lurie Hausrath, Anthony Vincent Longobardo and Brian Gene Ruppel It is certified that error appears in the above-identified patent and that said Letters Patent is hereby corrected as shown below:

On the Title Page

Item (73), Column 1 should read:
(73) Assignee: AGY Holding Corporation, Aiken, SC (US)

Signed and Sealed this
Fifteenth Day of September, 2020

Andrei Iancu
*Director of the United States Patent and Trademark Office*